US006891597B2

(12) United States Patent
Sekiguchi

(10) Patent No.: US 6,891,597 B2
(45) Date of Patent: May 10, 2005

(54) DRIVING APPARATUS, EXPOSURE APPARATUS, AND DEVICE MANUFACTURING METHOD

(75) Inventor: Hiroyuki Sekiguchi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/417,150

(22) Filed: Apr. 17, 2003

(65) Prior Publication Data

US 2003/0197850 A1 Oct. 23, 2003

(30) Foreign Application Priority Data

Apr. 22, 2002 (JP) .................................. 2002-119346

(51) Int. Cl.⁷ ............................................. G03B 27/42
(52) U.S. Cl. ....................... 355/53; 355/72; 310/10; 310/12; 318/611; 318/623; 318/625
(58) Field of Search .............................. 355/53, 72, 75; 310/10, 12; 318/611, 623, 625, 671

(56) References Cited

U.S. PATENT DOCUMENTS

| 5,172,160 | A |  | 12/1992 | Van Eijk et al. ............. 355/53 |
| 5,838,443 | A |  | 11/1998 | Sekiguchi ................... 356/363 |
| 5,959,427 | A |  | 9/1999 | Watson ....................... 318/687 |
| 6,025,688 | A |  | 2/2000 | Sekiguchi ................... 318/610 |
| 6,320,345 | B1 |  | 11/2001 | Yuan et al. .................. 318/569 |
| 6,359,679 | B1 |  | 3/2002 | Ito et al. ....................... 355/75 |
| 6,654,098 | B1 | * | 11/2003 | Asano et al. .................. 355/53 |
| 6,717,653 | B1 | * | 4/2004 | Iwamoto et al. .............. 355/72 |
| 2001/0015799 | A1 |  | 8/2001 | Asano et al. .................. 355/72 |
| 2002/0018195 | A1 |  | 2/2002 | Iwamoto et al. .............. 355/72 |

FOREIGN PATENT DOCUMENTS

| EP | 1 111 470 A2 |   | 6/2001 |
| EP | 1 168 084 | * | 2/2002 |
| JP | 3-21894 |   | 1/1991 |
| JP | 5-77126 |   | 3/1993 |
| JP | 5-121294 |   | 5/1993 |
| JP | 8-51126 |   | 2/1996 |
| JP | 11-16828 |   | 1/1999 |
| JP | 11-312643 |   | 11/1999 |
| JP | 2000-77301 |   | 3/2000 |
| JP | 2000-206279 |   | 7/2000 |
| JP | 2001-195130 |   | 7/2001 |
| JP | 2001-217172 |   | 8/2001 |
| JP | 2002-8971 |   | 1/2002 |

OTHER PUBLICATIONS

Japanese Office Action dated Jun. 18, 2004, issued in a corresponding Japanese patent application, No. 2002–119346.

European Search Report dated Jun. 24, 2004, issued in corresponding European patent appln. No. 03 25 2391, forwarded in a Communication dated Jul. 12, 2004.

\* cited by examiner

*Primary Examiner*—D. Rutledge
(74) *Attorney, Agent, or Firm*—Fitzpatrick, Cella, Harper & Scinto

(57) ABSTRACT

A driving apparatus which drives an object along a guide surface in X and Y directions. The apparatus includes a first actuator which drives the object in the X direction, a second actuator which drives the object in the Y direction, and a controller which controls the first and second actuators. The first and second actuators each have a reaction force counter which moves upon receipt of a reaction force generated in driving the object. In moving the object standing at a first position to a second position and stopping the object, the controller controls the first and second actuators such that acceleration periods of the two coincide and deceleration periods of the two coincide. Also, the object moves on a straight line connecting the first position and the second position.

19 Claims, 10 Drawing Sheets

DRIVING APPARATUS, EXPOSURE APPARATUS, AND DEVICE MANUFACTURING METHOD

FIELD OF THE INVENTION

The present invention relates to a driving apparatus, an exposure apparatus, and a device manufacturing method and, for example, to a driving apparatus which moves an object along a guide surface in the X and Y directions, an exposure apparatus which incorporates the driving apparatus, and a device manufacturing method using the exposure apparatus.

BACKGROUND OF THE INVENTION

Typical exposure apparatuses used to manufacture devices such as a semiconductor device include a step & repeat exposure apparatus (also called a stepper) which projects, through a projection optical system, the pattern of a master (reticle or mask) onto a plurality of exposure regions on a substrate and sequentially transfers the pattern onto the plurality of exposure regions while stepping the substrate (e.g., a wafer or glass substrate) and a step & scan exposure apparatus (also called a scanner) which repeats step movement and scanning exposure to sequentially transfer the pattern of a master onto a plurality of exposure regions on a substrate. Among these exposure apparatuses, the step & scan exposure apparatus uses only a light component, of exposure light, relatively close to the optical axis of the projection optical system by restricting the exposure light through a slit. Accordingly, the scanner enables higher-precision exposure of a fine pattern with a larger field angle.

These exposure apparatuses have a stage apparatus or driving apparatus (wafer stage or reticle stage) which moves a wafer and reticle at high speed and aligns them. When a stage is driven in such an exposure apparatus, the acceleration/deceleration of the stage entails generation of the reaction force of an inertial force. Transmission of this reaction force to a stage surface plate causes vibrations of the stage surface plate. Such vibrations induce natural vibrations in the mechanism of the exposure apparatus, and high-frequency vibrations occur. This may interfere with high-speed, high-precision alignment.

To solve the above-described problems that pertain to a reaction force, several proposals have been made. For example, an apparatus described in Japanese Patent Laid-Open No. 5-77126 adopts a system in which the stator of a linear motor for driving a stage is supported on a floor independently of a stage surface plate, thereby avoiding vibrations of the stage surface plate due to a reaction force. An apparatus described in Japanese Patent Laid-Open No. 5-121294 adopts a system in which an actuator applies a compensation force, which is equivalent to a reaction force generated upon stage driving, to a force generated in the horizontal direction for a machine frame which supports a wafer stage and projection lens, thereby reducing vibrations of the apparatus due to the reaction force.

Though in any of the above conventional apparatuses, swings of a stage apparatus itself can be reduced, a reaction force generated upon stage driving is transmitted to a floor directly or through a member substantially integrated with the floor. This vibrates the floor, which in turn causes devices placed around an exposure apparatus to vibrate and may adversely affect them. Generally, the floor on which an exposure apparatus is placed has a natural frequency of 20 to 40 Hz. When natural vibrations are induced as the exposure apparatus operates, an adverse effect on the peripheral devices increases.

These days, stage acceleration is increasing along with an increase in processing speed (throughput). For example, in a step & scan exposure apparatus, the maximum acceleration of a stage reaches 4G for a reticle stage or 1G for a wafer stage. In addition, the mass of a stage increases along with an increase in size of a reticle and substrate. For this reason, a driving force defined by <mass of moving member>× <acceleration> becomes very large, and its reaction force becomes enormous. As such a reaction force increases, vibrations of an installation floor due to the reaction force have become non-negligible.

Moreover, the sizes of apparatuses noticeably increase, and an increase in footprint in a manufacturing factory, on which a large number of manufacturing apparatuses are to be placed, is becoming evident as a problem. More specifically, if vibrations transmitted from some apparatuses to the floor are strong, the distances between the apparatuses need to be increased to prevent the other apparatuses from being affected by the vibrations. Consequently, the area virtually occupied by the apparatuses becomes large.

In consideration of the above-described background, the present application considers that a method of using a stator as a reaction force counter which receives a driving reaction force from a movable portion is effective in a driving apparatus which drives the movable portion by an electromagnetic actuator comprising a movable element and the stator.

SUMMARY OF THE INVENTION

The present invention is based on the above-described consideration, and has as its object to, e.g., cancel a driving reaction force generated upon driving an object or to reduce its effect.

According to the first aspect of the present invention, there is provided a driving apparatus which drives an object along a guide surface in X and Y directions. This driving apparatus comprises a first actuator which drives the object in the X direction, a second actuator which drives the object in the Y direction, and a controller which controls the first and second actuators. The first and second actuators each have a reaction force counter which moves upon receipt of a reaction force generated in driving the object. More preferably, in moving the object standing at a first position to a second position and stopping the object, the controller controls the first and second actuators such that the object moves on a straight line connecting the first position and second position.

According to a preferred embodiment of the present invention, the reaction force counter preferably comprises a first reaction force counter serving as a stator of the first actuator and a second reaction force counter serving as a stator of the second actuator.

According to a preferred embodiment of the present invention, the controller preferably controls the first and second actuators such that, for example, an acceleration period during which the first actuator accelerates the object and an acceleration period during which the second actuator accelerates the object coincide with each other, and a deceleration period during which the first actuator decelerates the object and a deceleration period during which the second actuator decelerates the object coincide with each other.

According to a preferred embodiment of the present invention, the driving apparatus preferably further comprises, e.g., a third actuator which drives the first reaction force counter and a fourth actuator which drives the second reaction force counter. The controller preferably controls the third and fourth actuators so as to cancel a reaction force generated upon driving the object or to reduce an effect of the reaction force. Alternatively, the controller preferably controls the third and fourth actuators so as to cancel a moment reaction force generated upon driving the object or to reduce an effect of the moment reaction force. For example, the controller preferably controls the first, second, third, and fourth actuators such that an acceleration period during which the first and second actuators accelerate the object and an acceleration period during which the third and fourth actuators accelerate the first and second reaction force counters coincide with each other, and a deceleration period during which the first and second actuators decelerate the object and a deceleration period during which the third and fourth actuators decelerate the first and second reaction force counters coincide with each other.

According to a preferred embodiment of the present invention, for example, it is preferable that the first actuator be arranged on each of a −Y direction side and a +Y direction side of the object, and the second actuator be arranged on each of a −X direction side and a +X direction side of the object.

According to a preferred embodiment of the present invention, for example, it is preferable that the first actuator be arranged on each of a −Y direction side and a +Y direction side of the object, the second actuator be arranged on each of a −X direction side and a +X direction side of the object, and the driving apparatus further comprise a pair of third actuators which drive first reaction force counters of a pair of the first actuators, respectively, and a pair of fourth actuators which drive first reaction force counters of a pair of the first actuators, respectively. The controller preferably controls the pair of third actuators and the pair of fourth actuators so as to cancel a reaction force generated upon driving the object or to reduce an effect of the reaction force. Alternatively, the controller preferably controls the pair of third actuators and the pair of fourth actuators so as to cancel a moment reaction force generated upon driving the object or to reduce an effect of the moment reaction force.

According to the second aspect of the present invention, there is provided a driving apparatus which drives an object along a guide surface in X and Y directions, comprising a first actuator which drives the object in the X direction, a second actuator which drives the object in the Y direction, and a controller which controls the first and second actuators. The first actuator has a first reaction force counter which moves upon receipt of a reaction force generated in driving the object, and the second actuator has a second reaction force counter which moves upon receipt of a reaction force generated in driving the object. In moving the object standing at a first position to a second position and stopping the object, the controller controls the first and second actuators such that a driving force with which the first and second actuators drive the object and a moment reaction force uniquely defined by coordinates of a first position and coordinates of a second position are generated.

According to the third aspect of the present invention, there is provided an exposure apparatus comprising the above-described driving apparatus configured as a substrate stage which drives a structure including a chuck for holding a substrate, wherein a pattern is projected onto the substrate through a projection optical system to expose the substrate.

According to the fourth aspect of the present invention, there is provided a device manufacturing method for a semiconductor device, or the like, comprising a step of coating a substrate with a photosensitive agent, a step of exposing the substrate using the above-described exposure apparatus, and a step of developing the substrate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

A preferred embodiment of the present invention will be described below with reference to the accompanying drawings.

Figure 4A:
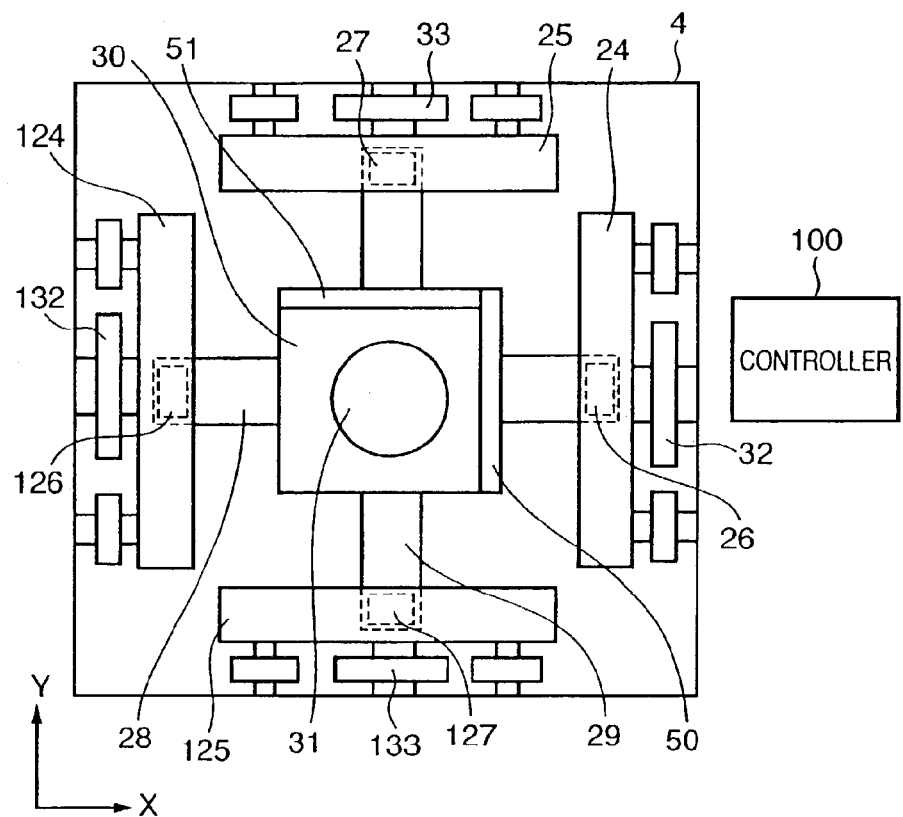
FIGS. 4A and 4B are views showing the driving apparatus (stage apparatus) of the preferred embodiment of the present invention.
Figure 4B:
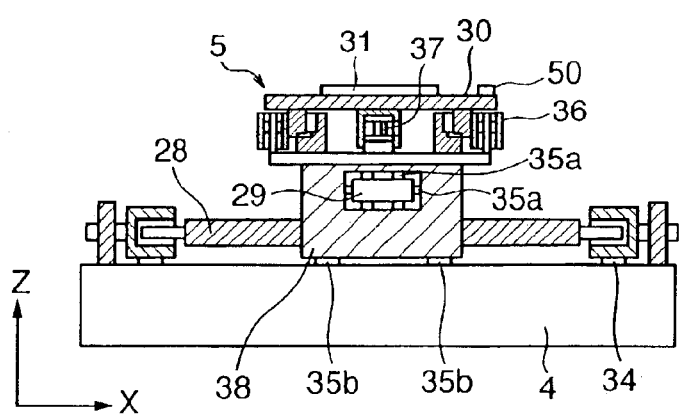

FIGS. 4A and 4B are a plan view and a sectional view showing the wafer stage of an exposure apparatus as a preferred embodiment of the present invention, which uses the stator of an actuator as a reaction force counter to receive the driving reaction force of a movable element, respectively.

In FIGS. 4A and 4B, a wafer chuck 31, and bar mirrors 50 and 51 for position measurement are provided on a top plate 30. The wafer chuck 31 vacuum-chucks and holds a wafer serving as an object to be aligned. The bar mirrors 50 and 51 reflect measurement light from a laser interferometer (not shown). The top plate 30 levitates in non-contact to an X-Y slider 38 by a lightweight compensator (not shown), which uses a magnet and has six degrees of freedom in six axial direction. The top plate 30 is finely driven in six axial directions (X, Y, and Z directions and their rotational directions) by an actuator which generates a driving force between the top plate 30 and the X-Y slider 38. Two linear motors in the X direction, one linear motor in the Y direction, and three linear motors in the Z direction are provided as actuators for fine moving in six axial directions. If the two X-direction fine moving linear motors are driven in opposite direction, the top plate 30 can be driven about the Z-axis (θ direction). By adjusting the driving forces of the three Z-direction fine moving linear motors, the top plate 30 can be driven about the X-axis (ωX direction) and about the Y-axis (ωY direction). A coil serving as the stator of the fine moving linear motor is provided on the side of the X-Y slider 38, and a permanent magnet serving as the movable element of the fine moving linear motor is provided on the side of the top plate 30.

The X-Y slider 38 is guided by an X guide bar 28 and a Y guide bar 29 through an air bearing (static pressure bearing) 35a. The X-Y slider 38 is guided in the Z-axis direction on the upper surface of a reference structure 4 by an air bearing (static pressure bearing) 35b.

Movable elements (magnets) 26, 126, 27 and 127 of linear motors are attached near the two ends of the X guide bar 28 and those of the Y guide bar 29. A Lorentz force is generated by causing a current to flow through two X linear motor stators and two Y linear motor stators (coils) 24, 124, 25 and 125 under the control of a controller 100, thereby driving the X guide bar 28 in the Y direction and the Y guide bar 29 in the X direction. The two X linear motor stators and two Y linear motor stators (coils) 24, 124, 25 and 125 are guided in the Z direction on the upper surface of the reference structure 4 by air bearings (static pressure bearings) 34 and have the degrees of freedom in the X and Y directions (plane direction).

The linear motor stators 24, 124, 25, and 125, which serve as reaction force counters as well as actuators, will be referred to as YR, YL, XB, and XF hereinafter, respectively.

The linear motor stators 24 and 124 are driven in the Y direction by linear motor stator control linear motors 32 and 132 under the control of the controller 100. Similarly, the linear motor stators 25 and 125 are driven in the X direction by linear motor stator control linear motors 33 and 133 under the control of the controller 100.

The background of the present invention will be described with reference to FIGS. 4A and 4B. A case will be explained wherein the X-Y slider 38 is moved only in the X direction at a Y-coordinate of 0. When the Y guide bar 29 is driven in the X direction by a Lorentz force, a force is applied to the X-Y slider 38 in the X direction through the static pressure bearing 35a. A combination of the X-Y slider 38 and Y guide bar 29 will be referred to as an X movable portion hereinafter. When the X movable portion is accelerated/decelerated, a reaction force generated due to the acceleration/deceleration acts on the X linear motor stators 25 and 125.

Since the X linear motor stators 25 and 125 are supported movably in the X and Y directions by the static pressure bearings 34, the reaction force moves the X linear motor stators 25 and 125 in the X direction. The acceleration and velocity at the time of movement depends on the ratio between the mass of the X linear motor stators 25 and 125 and that of the X movable portion. For example, assume that the mass of the X linear motor stators 25 and 125 is 200 kg/piece, and the mass of the X movable portion is 40 kg. In this case, the mass ratio is 10:1, and accordingly the acceleration and velocity of the X linear motor stator 25 are ¹⁄₁₀ those of the X movable portion. When the X linear motor stators 25 and 125 move in the X direction in this manner, a reaction force in the X direction, which is applied to the X linear motor stator 25, is not transmitted to the reference structure 4. The same applies to a case wherein the X-Y slider 38 is driven only in the Y direction at an X-coordinate of 0.

However, if the X-Y slider 38 is driven in the X and Y directions, i.e., two-dimensionally, a driving reaction force from a moment component (to be referred to as a moment reaction force hereinafter) is generated. For this reason, a reaction force cannot be absorbed in a simple manner as described above. As an example, a control method will be considered in which when the X-Y slider 38 is driven two-dimensionally, i.e., in the X and Y directions, an X-direction control system and a Y-direction control system are independent of each other, and both an X-direction driving profile and a Y-direction driving profile are made to always exhibit the maximum acceleration and maximum velocity to give a higher priority to the throughput.

Figure 5:
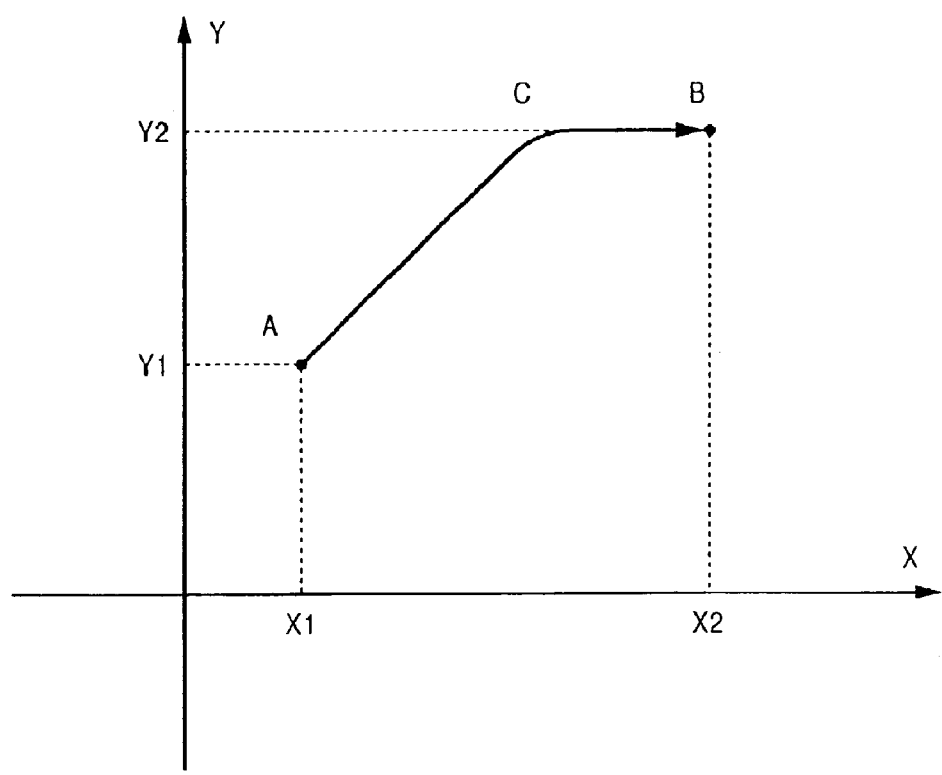
FIG. 5 is a graph of the X-Y plane coordinates for explaining problems in a method of moving a general movable portion.
Figure 6A:
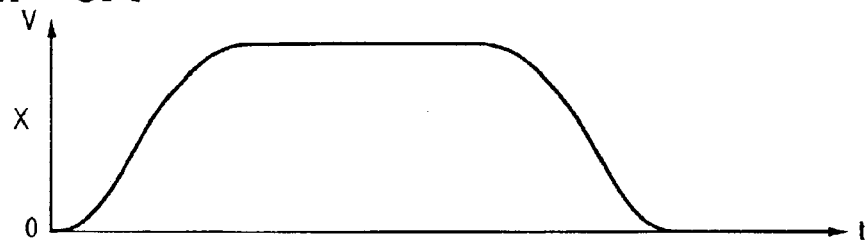
FIGS. 6A to 6F are graphs showing the general driving profiles of an X actuator and a Y actuator in a driving apparatus.
Figure 6B:
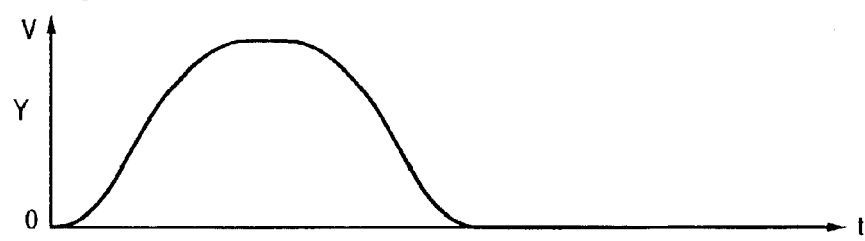
Figure 6C:
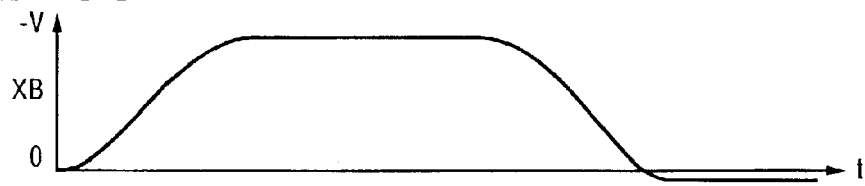
Figure 6D:
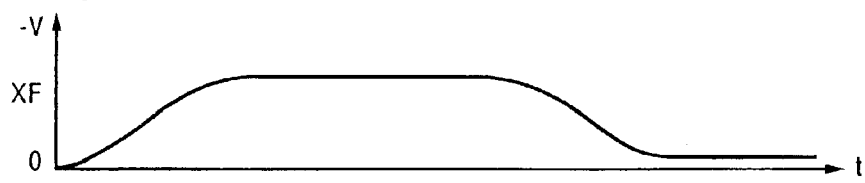
Figure 6E:
Figure 6F:

In this control method, when an X-Y slider 38 to be driven from a point A to a point B in the X-Y plane shown in FIG. 5, an X-driving profile and a Y-driving profile as shown in FIGS. 6A and 6B are used to drive the X-Y slider 38. When the maximum acceleration of a stage apparatus or driving apparatus is 1G, and the maximum velocity is 1 m/s, the X-Y slider 38 is so driven so as to make the driving profiles of FIGS. 6A and 6B for both the X- and Y-axes exhibit a maximum acceleration of 1G and a maximum velocity of 1 m/s, respectively.

If the X-Y slider 38 is driven using the driving profiles as shown in FIGS. 6A and 6B, the X-Y slider 38 moves to plot a locus as shown in FIG. 5. During this movement, a driving force is generated when the X-Y slider 38 is near the point A, the point B, and a point C.

At this time, the linear motor stators 24 (YR), 25 (XB), 124 (YL), and 125 (XF) as reaction force counters so move as to cancel the driving force. The reaction force counters receive different reaction force components, depending on the position of the X-Y slider 38. That is, since a moment reaction force applied to the X guide bar 28, which receives and transmits a reaction force of Y-direction driving, varies in accordance with the X-coordinate of the X-Y slider 38, a difference occurs between a reaction force component received by the reaction force counter (YL) 124 and that received by the reaction force counter (YR) 24. Similarly, since a moment reaction force applied to the Y guide bar 29, which receives and transmits a reaction force of X-direction driving, varies in accordance with the Y-coordinate of the X-Y slider 38, a difference occurs between a reaction force component received by the reaction force counter (XF) 125 and that received by the reaction force counter (XB) 25.

More specifically, in FIG. 5, since the driving start position of the X-Y slider 38 lies in the +X and +Y directions of the origin, the reaction force counter (YR) 24 receives a stronger reaction force component than the reaction force counter (YL) 124, and the reaction force counter (XB) 25 receives a stronger reaction force component than the reaction force counter (XF) 125.

When the X-Y slider 38 moves while plotting the locus as shown in FIG. 5, moment reaction forces received by the X guide bar 28 and Y guide bar 29 vary in accordance with the position of the X-Y slider 38. Accordingly, for a moment reaction force generated when the X-Y slider 38 is driven while plotting the locus as shown in FIG. 5, since the X-Y slider 38 is accelerated/decelerated at an arbitrary position in X-driving/Y-driving, the sum of a moment reaction force generated at the time of acceleration and that generated at the time of deceleration does not equal to 0.

The fact that the sum of a moment reaction force generated at the time of acceleration and that generated at the time of deceleration does not equal to 0 means that if the reaction force counters XB, XF, YL, and YR are so moved as to completely cancel a driving reaction force including a moment component, the moving velocities of the reaction force counters XB, XF, YL, and YR are as shown in FIGS. 6C to 6F, and the reaction force counters XB, XF, YL, and YR cannot stop. In other words, the reaction force counters inevitably have effective strokes, and thus it is difficult to completely cancel a moment reaction force.

Figure 1:
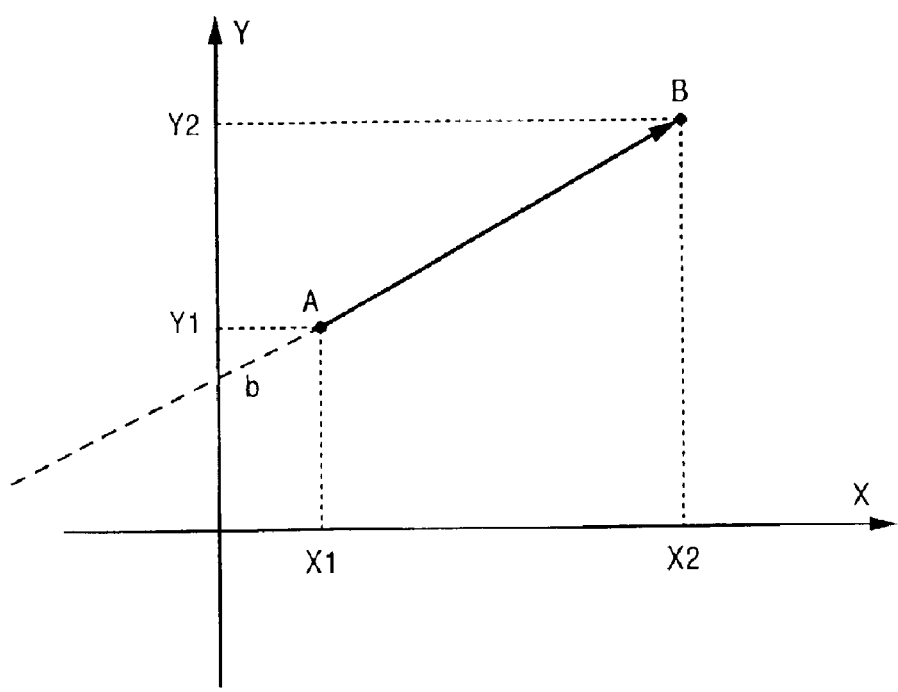
FIG. 1 is a graph of the X-Y plane coordinates showing a method of driving a movable portion in a driving apparatus (stage apparatus) of a preferred embodiment of the present invention.

The preferred embodiment of the present invention will be described next. A case will be considered wherein the X-Y slider 38 in FIG. 4 moves from an arbitrary point A $(x_1,y_1)$ to a point B $(x_2,y_2)$ in a coordinate system as shown in FIG. 1. The origin (0,0) of this coordinate system is set to a point at which no moment reaction force is generated for the reaction force counters (YR, YL, XB, and XF) 24, 124, 25, and 125. In the driving apparatus shown in FIG. 4, a point at which the X-Y slider 38 is standing is the origin (0,0).

According to the preferred embodiment of the present invention, an acceleration period in the driving profiles of the linear motors (25, 27, 125, and 127) for driving the X-Y slider 38 in the X direction and that in the driving profiles of the linear motors (24, 26, 124, and 126) for driving the X-Y slider 38 in the Y direction are made to coincide (i.e., synchronize) with each other, and a deceleration period in the driving profiles of the linear motors (25, 27, 125, and 127) for X-direction driving and that in the driving profiles of the linear motors (24, 26, 124, and 126) for the Y-direction driving are made to coincide (i.e., synchronize) with each other. The controller 100 controls the linear motors (25, 27, 125, and 127) for X-direction driving and the linear motors (24, 26, 124, and 126) for Y-direction driving on the basis of the driving profiles for controlling to drive the respective linear motors.

Figure 2A:
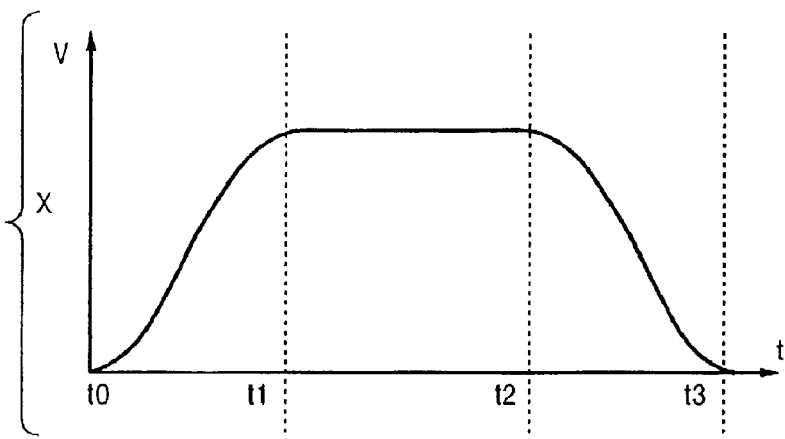
FIGS. 2A and 2B are graphs showing the driving profiles of an X actuator and a Y actuator in the driving apparatus of the preferred embodiment of the present invention.
Figure 2B:
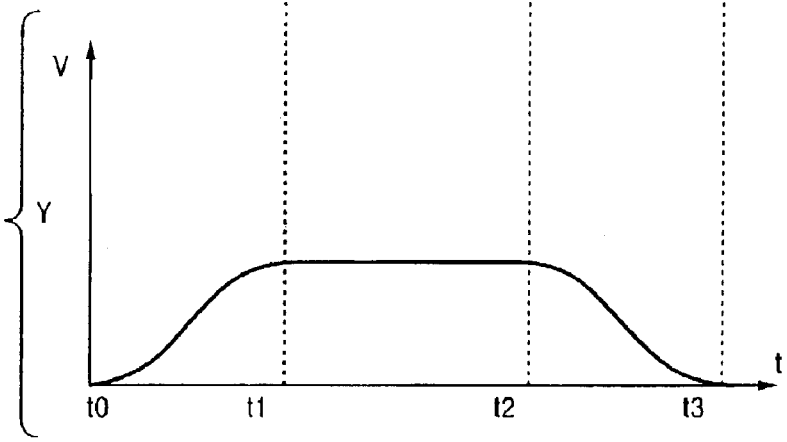

An example of the above control will be described. The controller 100 controls the linear motors (25, 27, 125, and 127) for X-direction driving and the linear motors (24, 26, 124, and 126) for Y-direction driving in accordance with X-direction and Y-direction driving profiles as shown in FIGS. 2A and 2B, thereby driving the X-Y slider 38. Referring to FIGS. 2A and 2B, a period from t0 to t1 is an acceleration period. The controller 100 causes the linear motors (25, 27, 125, and 127) for X-direction driving and the linear motors (24, 26, 124, and 126) for Y-direction driving to synchronize with each other and accelerates the X-Y slider 38 during the period from t0 to t1. At this time, the vector of the resultant force of an acceleration force by the linear motors for X-direction driving and that by the linear motors for Y-direction driving always have the same direction as that of a vector $AB_{vec}$ heading from the point A toward the point B. Note that VEC will be affixed to a vector as a subscript in this specification.

A period from t1 to t2 in FIGS. 2A and 2B is a constant-velocity period. The controller 100 causes the linear motors for X-direction driving and the linear motors for Y-direction driving to operate at a constant velocity such that the X-Y slider 38 moves between A and B at a constant velocity.

A period from t2 to t3 in FIGS. 2A and 2B is a deceleration period. The controller 100 causes both the linear motors for X-direction driving and the linear motors for Y-direction driving to synchronize with each other and decelerates and stops the X-Y slider 38 during the period from t2 to t3. At this time, the vector of the resultant force of a deceleration force by the linear motors for X-direction driving and that by the linear motors for Y-direction driving is always a vector $BA_{vec}$, i.e., has the same direction as a direction opposite to that of the vector $AB_{vec}$ at the time of acceleration.

As described above, according to the preferred embodiment of the present invention, the acceleration period in the driving profiles of the linear motors for X-direction driving and that in the driving profiles of the linear motors for Y-direction driving are made to coincide (i.e., synchronize) with each other, and the deceleration period in the driving profiles of the linear motors for X-direction driving and that in the driving profiles of the linear motors for Y-direction driving are made to coincide (i.e., synchronize) with each other, thereby driving the X-Y slider 38 from the point A to the point B in a straight orbit, as shown in FIG. 1.

Under these driving conditions, a driving force $F_{vec}(t)$ generated upon moving the X-Y slider 38 from the point A to the point B in accordance with the driving profiles in FIGS. 2A and 2B is represented as a vector time function by equation (1):

$$F_{vec}(t) = \frac{AB_{vec}}{|AB_{vec}|} F(t) \quad (1)$$

Figure 3A:
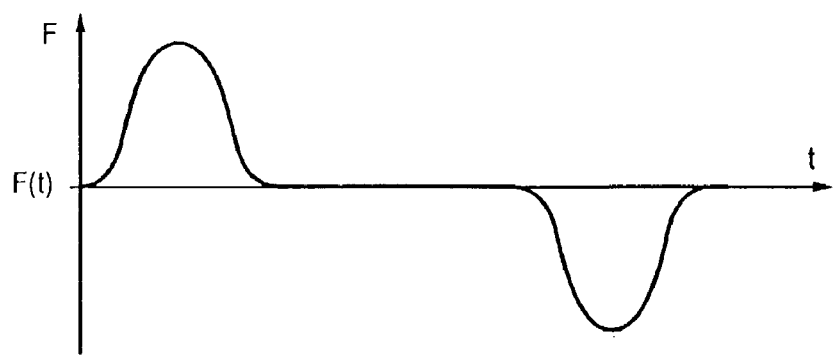
FIGS. 3A to 3D are graphs showing the driving force F(t), driving velocity V(t), moment reaction force γ(t), and moving velocity Vr(t) of a reaction force counter which moves upon receipt of a moment reaction force in the driving apparatus of the preferred embodiment of the present invention, respectively.

More specifically, the driving force $F_{vec}(t)$ applied to the X-Y slider 38 is obtained by multiplying a unit vector with a direction heading from the point A toward the point B by a scalar function F(t) as shown in FIG. 3A.

A moment reaction force generated at this time will be considered. A moment reaction force $\gamma_y(t)$ applied to the Y guide bar 29 is represented by equation (2):

$$\gamma_y(t) = y(t)F(t)\cos\theta \quad (2)$$

A moment reaction force $\gamma_x(t)$ applied to the X guide bar 28 is represented by equation (3):

$$\gamma_x(t) = -x(t)F(t)\sin\theta \quad (3)$$

The resultant force $\gamma(t)$ of these moment reaction forces is represented by equation (4):

$$\gamma(t) = y(t)F(t)\cos\theta - x(t)F(t)\sin\theta \quad (4)$$
$$= F(t)(y(t)\cos\theta - x(t)\sin\theta)$$

where $$y(t) = x(t)\tan\theta + b \quad (5)$$

Substitution of equation (5) into equation (4) yields equation (6):

$$\gamma(t) = F(t)((x(t)\tan\theta + b)\cos\theta - x(t)\sin\theta) \quad (6)$$
$$= F(t)(x(t)\sin\theta + b\cos\theta - x(t)\sin\theta)$$
$$= F(t)b\cos\theta$$

Since y(t) passes through a point $(x_1, y_1)$, b is calculated by equation (7):

$$b = y_1 - x_1 \tan\theta \quad (7)$$

Substitution of equation (7) into equation (6) yields equation (8):

$$\gamma(t) = F(t)b\cos\theta \quad (8)$$
$$= F(t)(y_1\cos\theta - x_1\sin\theta)$$

Representing $\sin\theta$ and $\cos\theta$ in equation (8) with $(x_1, y_1)$ and $(x_2, y_2)$ yields equations (9):

$$\sin\theta = \frac{y_2 - y_1}{\sqrt{(x_2-x_1)^2 + (y_2-y_1)^2}} \quad (9)$$

$$\cos\theta = \frac{x_2 - x_1}{\sqrt{(x_2-x_1)^2 + (y_2-y_1)^2}}$$

Therefore, the moment reaction force is represented by equation (10):

$$\gamma(t) = F(t)\frac{x_2 y_1 - x_1 y_2}{\sqrt{(x_2-x_1)^2 + (y_2-y_1)^2}} \quad (10)$$

According to a driving method of the preferred embodiment of the present invention, the moment reaction force $\gamma(t)$ is a constant multiple of the driving force $F(t)$, and the constant is uniquely defined by the coordinates of the driving start position A and the stop position B.

Figure 3B:
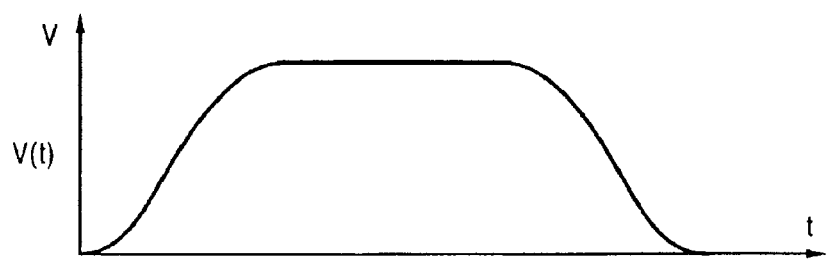

F(t) is a driving force for causing the X-Y slider 38 to start at the point A and stop at the point B. The scalar velocity on the vector $AB_{vec}$ of the X-Y slider 38 at this time is as shown in FIG. 3B.

Figure 3C:
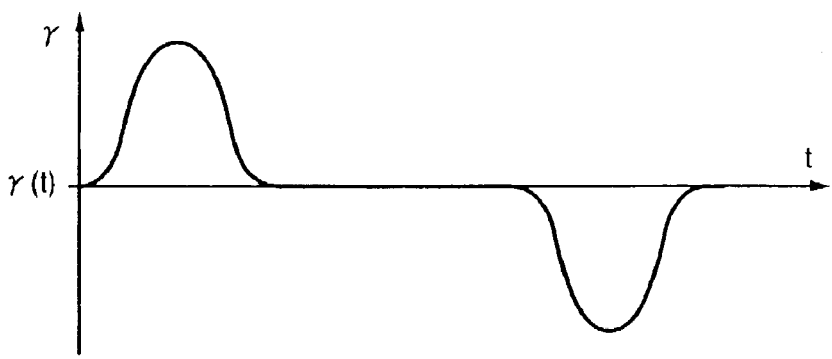
Figure 3D:
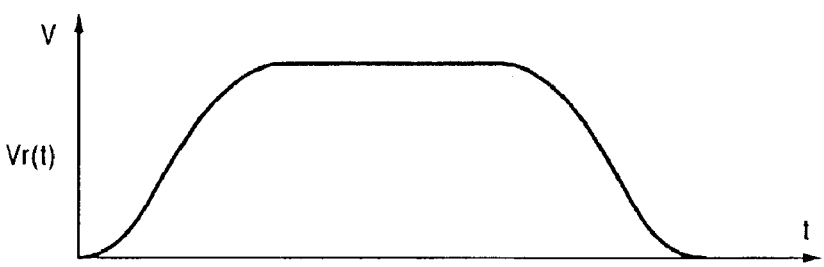

Accordingly, the moment reaction force $\gamma(t)$, which is a constant multiple of F(t), is represented by a time function as shown in FIG. 3C, and the moving velocity of a reaction force counter, which moves upon receipt of a moment reaction force, is expected to be as shown in FIG. 3D. As shown in FIG. 3D, according to the driving method of the preferred embodiment of the present invention, the velocity of a reaction force counter is finally bound to become 0, and the reaction force counter can always be stopped.

Furthermore, a method of distributing the moment reaction force $\gamma(t)$ into the reaction force counters to completely cancel the driving force of the X-Y slider 38 will be described below.

In the driving apparatus of FIG. 4, as reaction force counters each comprising the stator of a linear motor, four separated reaction force counters XB (25), XF (125), YR (24), and YL (124) are used.

First, an X-direction driving reaction force component can be canceled by the reaction force counters (XB) 25 and (XF) 125. Letting $F_x(t)$ be the X-direction component of the driving force $F_{vec}(t)$ of the X-Y slider 38, $F_x(t)$ is the driving force of the two X linear motors (the pair of the stator 25 and movable element 27 and the pair of the stator 125 and movable element 127), and its reaction force is $-F_x(t)$. The reaction force counters (XB) 25 and (XF) 125, which comprise the stators of the X linear motors, receive a reaction force in the X direction, $-F_x(t)$. Let $F_{XF}(t)$ be a force applied to the reaction force counter (XF) 125, and $F_{XB}(t)$ be a force applied to the reaction force counter (XB) 25. If the following equation. (11) holds, a reaction force component in the X direction can be canceled.

$$F_x(t) = -(F_{XF}(t) + F_{XB}(t)) \quad (11)$$

Similarly, a Y-direction driving reaction force component can be canceled by the reaction force counters (YL) 124 and (YR) 24. Letting $F_y(t)$ be the Y-direction component of the driving force $F_{vec}(t)$ of the X-Y slider 38, $F_y(t)$ is the driving force of the Y linear motors (26 and 126), and its reaction force is $-F_y(t)$ The reaction force counters (YL) 126 and (YR) 26, which comprise the stators of the Y linear motors, receive a reaction force in the Y direction, $-F_y(t)$. Let $F_{YL}(t)$ be a force applied to the reaction force counter (YL) 126, and $F_{YR}(t)$ be a force applied to the reaction force counter (YR) 26. If the following equation (12) holds, a reaction force component in the Y direction can be canceled.

$$F_y(t) = -(F_{YL}(t) + F_{YR}(t)) \quad (12)$$

Figure 7:
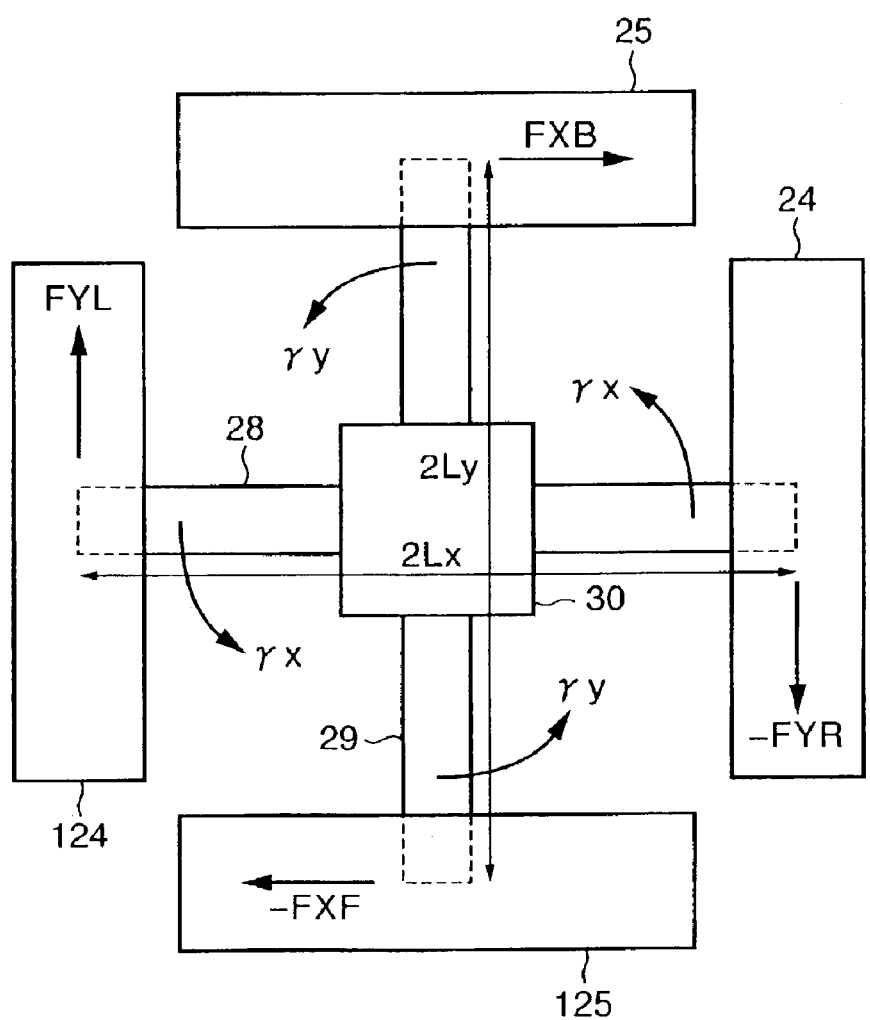
FIG. 7 is a view for explaining the moment reaction force of a driving apparatus.

Moreover, a reaction force in the direction of a moment will be considered. FIG. 7 shows a reaction force in the direction of the moment. As shown in FIG. 7, letting $\gamma_x(t)$ be a moment reaction force applied to the X guide bar 28, $2L_x$ be the length of the X guide bar 28, $\gamma_y(t)$ be a moment reaction force applied to the Y guide bar 29, and $2L_y$ be the length of the Y guide bar 29, $\gamma_x(t)$ and $\gamma_y(t)$ are represented by equations (13):

$$\gamma_x(t) = -(F_{YL}(t) + F_{YR}(t))L_x$$
$$\gamma_y(t) = -(F_{XB}(t) + F_{XF}(t))L_y \quad (13)$$

Since the moment reaction force $\gamma(t)$ is the sum of the moment $\gamma_x(t)$ applied to the X guide bar 28 and the moment $\gamma_y(t)$ applied to the Y guide bar 29, the moment reaction force can be canceled if the following equation (14) holds.

$$\gamma(t) = \gamma_x(t) + \gamma_y(t) \quad (14)$$
$$= -(F_{YL}(t) - F_{YR}(t))L_x - (F_{XB}(t) - F_{XF}(t))L_y$$

According to the preferred embodiment of the present invention, concurrently with the driving of the X-Y slider 38, the controller 100 controls the linear motor stator control linear motors 133, 33, 132, and 32 shown in FIG. 4, thereby driving the reaction force counters XF (125), XB (25), YL (124), and YR (24), which comprise the stators of the linear motors, with a force to be given by equations (15). In accordance with equations (15), the acceleration period in the driving profiles of the linear motors (25, 27, 125, and 127) for X-direction driving and that in the driving profiles of the linear motors (24, 26, 124, and 126) for Y-direction driving coincide with each other, and the deceleration period in the driving profiles of the linear motors (25, 27, 125, and 127) for X-direction driving and that in the driving profiles of the linear motors (24, 26, 124, and 126) for the Y-direction driving coincide with each other.

$$F_{XF}(t) = -(F_x(t) - \gamma(t)\alpha)/2$$
$$F_{XB}(t) = -(F_x(t) + \gamma(t)\alpha)/2$$
$$F_{YL}(t) = -(F_y(t) + \gamma(t)\beta)/2$$
$$F_{YR}(t) = -(F_y(t) - \gamma(t)\beta)/2 \quad (15)$$

The reaction force counters XF (125), XB (25), YL (124), and YR (24) are driven by the linear motors 133, 33, 132, and 32 to satisfy equations (15), so that a force applied in the X direction is represented by equation (16):

$$-(F_{XF}(t)+F_{XB}(t))=F_x(t) \quad (16)$$

That is, since equation (11) holds, the reaction force component in the X direction can completely be canceled. Similarly, a force applied in the Y direction is represented by equation (17):

$$-(F_{YL}(t)+F_{YR}(t))=F_y(t) \quad (17)$$

That is, since equation (12) holds, the reaction force component in the Y direction can completely be canceled. Additionally, the moment reaction force is represented by equation (18):

$$-(F_{YL}(t) - F_{YR}(t))L_x - (F_{XB}(t) - F_{XF}(t))L_y = (\beta L_x + \alpha L_y) \cdot \gamma(t) \quad (18)$$

$$\beta L_x + \alpha L_y = 1 \quad (19)$$

If α and β are so selected as to satisfy equation (19), equation (14) holds, and the moment reaction force can completely be canceled. For example, if α and β are selected as given by equations (20), the moment reaction force can be distributed only between the reaction force counters (YL) 124 and (YR) 24.

$$\begin{cases} \alpha = 0 \\ \beta = 1/L_x \end{cases} \quad (20)$$

If α and β are selected as given by equation (21), the moment reaction force can be distributed only between the reaction force counters (XF) 125 and (XB) 25.

$$\begin{cases} \alpha = 1/L_y \\ \beta = 0 \end{cases} \quad (21)$$

If α and β are selected as given by equation (22), the moment reaction force can be distributed among the four reaction force counters (XF) 125, (XB) 25, (YL) 124, and (YR) 24.

$$\begin{cases} \alpha = \dfrac{1}{2L_y} \\ \beta = \dfrac{1}{2L_x} \end{cases} \quad (22)$$

The driving strokes of the reaction force counters XF, XB, YL and YR, which comprise the linear motor stators, depend on the ratio between the weight of the reaction force counters XE, XB, YL and YR and that of the X-Y slider 38 serving as an X-Y movable portion, the top plate 30 on the X-Y slider 38, the wafer chuck 31, the bar mirrors 50 and 51, the X guide bar 28, and the Y guide bar 29. Accordingly, the weight of the reaction force counter is preferably as large as possible to shorten the stroke of the reaction force counter.

As described above, according to this embodiment, a reaction force generated upon driving the X-Y slider 38, including the reaction force of a moment component, can completely be canceled within the driving apparatus.

More specifically, according to a driving apparatus of the preferred embodiment of the present invention, when a movable object (structure including an X-Y slider, top plate, wafer chuck, and the like) is moved along a guide surface in the X and Y directions, i.e., two-dimensionally, an acceleration period of an X-direction actuator which drives the object in the X direction and that of a Y-direction actuator which drives the object in the Y direction are made to coincide (i.e., synchronize) with each other, and a deceleration period of the X-direction actuator and that of the Y-direction actuator are made to coincide (i.e., synchronize) with each other. This generates an acceleration/deceleration force in both the actuators simultaneously, so that the object can linearly be moved from a driving start position to a stop position. For this reason, the moment component of a driving reaction force generated at the time of acceleration and that of a driving reaction force generated at the time of deceleration become equal to each other, and even if a reaction force counter is so moved as to completely cancel a driving reaction force including a moment component, the reaction force counter can stop within an effective stroke.

According to the preferred embodiment of the present invention, let F be a driving force generated upon moving an object from coordinates $(x_1,y_1)$ to coordinates $(x_2,y_2)$ in the above driving apparatus. By distributing a moment reaction force γ in the rotational direction, represented by:

$$\gamma = F\left(\frac{x_2 y_1 - x_1 y_2}{\sqrt{(x_2 - x_1)^2 + (y_2 - y_1)^2}}\right)$$

among some of a plurality of reaction force counters, the moment reaction force can completely be canceled or its effect can be reduced.

Moreover, e.g., in the driving apparatus which has the four reaction force counters (XE) 125, (XB) 25, (YL) 124, and (YR) 24 as shown in FIGS. 4A and 4B, when an object is moved from the coordinates $(x_1,y_1)$ to the coordinates $(x_2,y_2)$, the acceleration period of the X-direction actuator and that of the Y-direction actuator are made to coincide (i.e., synchronize) with each other, and the deceleration period of the X-direction actuator and that of the Y-direction actuator are made to coincide (i.e., synchronize) with each other. This causes both the actuators to simultaneously accelerate/decelerate the object. Letting F be the driving force of the object at this time, a moment reaction force γ in the rotational direction is represented by:

$$\gamma = F\left(\frac{x_2 y_1 - x_1 y_2}{\sqrt{(x_2 - x_1)^2 + (y_2 - y_1)^2}}\right)$$

Let $F_{XF}$ be the driving force of the reaction force counter XF, $F_{XB}$ be the driving force of the reaction force counter XB, $F_{YR}$ be the driving force of the reaction force counter YR, $F_{YL}$ be the driving force of the reaction force counter YL, $F_X$ be the X-direction reaction force component of the driving force F of a stage, and Fy be the Y-direction reaction force component. Reaction force components and moment reaction force components in the X and Y directions, generated upon moving the object can completely be canceled within the driving apparatus without letting them leak outside by driving the reaction force counters (XF) 125, (XB) 25, (YL) 124, and (YR) 24 using the linear motor stator control linear motors 133, 33, 132, and 32, respectively, in accordance with command values corresponding to the following forces:

$$F_{XF}=-(F_x-\gamma\alpha)/2$$

$$F_{XB}=-(F_x+\gamma\alpha)/2$$

$$F_{YL}=-(F_y-\gamma\beta)/2$$

$$F_{YR}=-(F_y-\gamma\beta)/2$$

(where α and β are constants).

Figure 8:
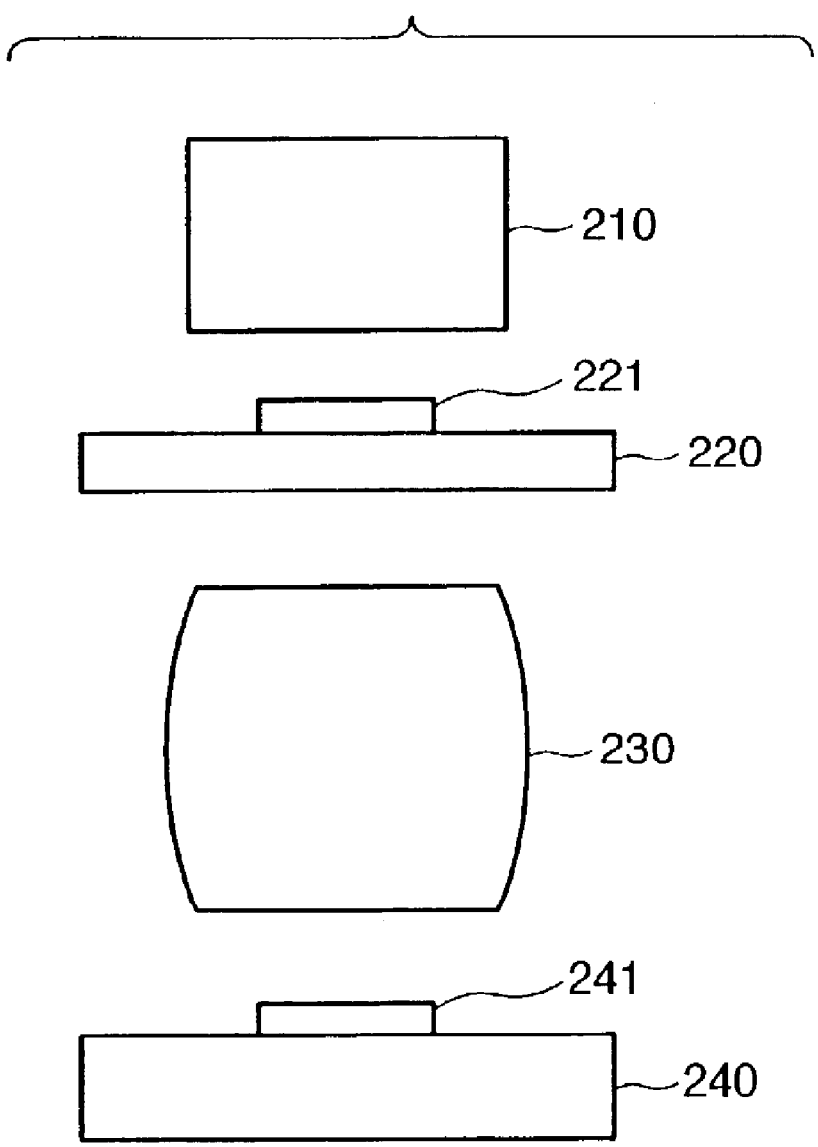
FIG. 8 is a view showing the schematic arrangement of an exposure apparatus incorporating the driving apparatus of the preferred embodiment of the present invention as a substrate stage.

FIG. 8 is a view showing the schematic arrangement of an exposure apparatus incorporating the above-described driving apparatus as a substrate stage. The exposure apparatus causes an illumination optical system 210 to illuminate a master (reticle or mask) 221, which is held by a master stage 220, and projects, through a projection optical system 230, the pattern of the master 221 onto a substrate (wafer) 241 on a substrate stage (wafer stage) 240, thereby exposing the substrate 241. As the substrate stage 240, the driving apparatus shown in FIG. 4 is employed.

As described above, according to an exposure apparatus incorporating a driving apparatus of the present invention, first, a reduction in vibrations generated upon master stage movement can increase precisions such as the overlay precision, line-width precision, and the like, and the throughput. Additionally, a decrease in influence on a floor of a reaction force generated upon stage acceleration/deceleration can decrease the influence on other apparatuses placed on the same floor and at the same time can decrease the distances to the other apparatuses. For this reason, it is possible to reduce a floor area required for one apparatus when a plurality of apparatuses are to be placed.

Figure 9:
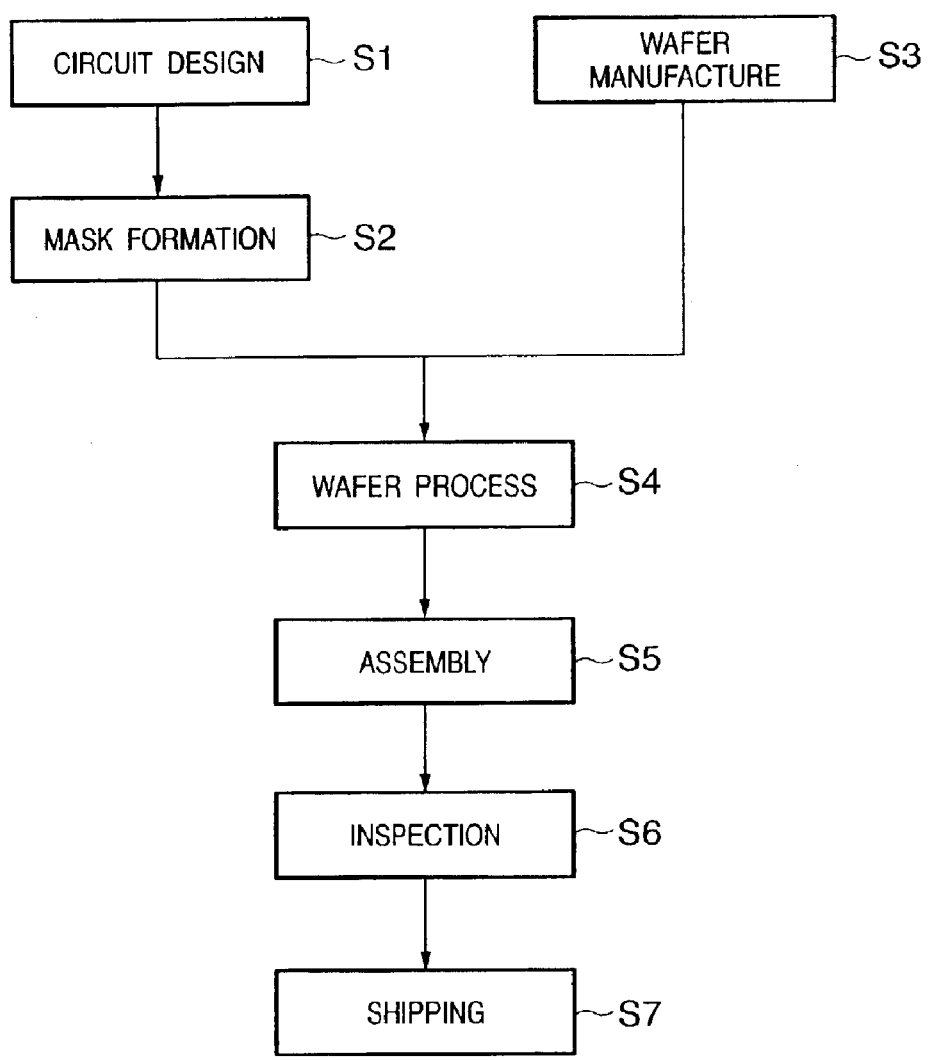
FIG. 9 is a flow chart showing the flow of the whole manufacturing process of a semiconductor device.

The manufacturing process of a semiconductor device using the above-described exposure apparatus will be described next. FIG. 9 shows the flow of the whole manufacturing process of the semiconductor device. In step 1 (circuit design), a semiconductor device circuit is designed. In step 2 (mask formation), a mask having the designed circuit pattern is formed. In step 3 (wafer manufacture), a wafer is manufactured by using a material such as silicon. In step 4 (wafer process), called a preprocess, an actual circuit is formed on the wafer by lithography using the prepared mask and wafer. Step 5, (assembly), called a post-process is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test. After these steps, the semiconductor device is completed and shipped (step 7).

Figure 10:
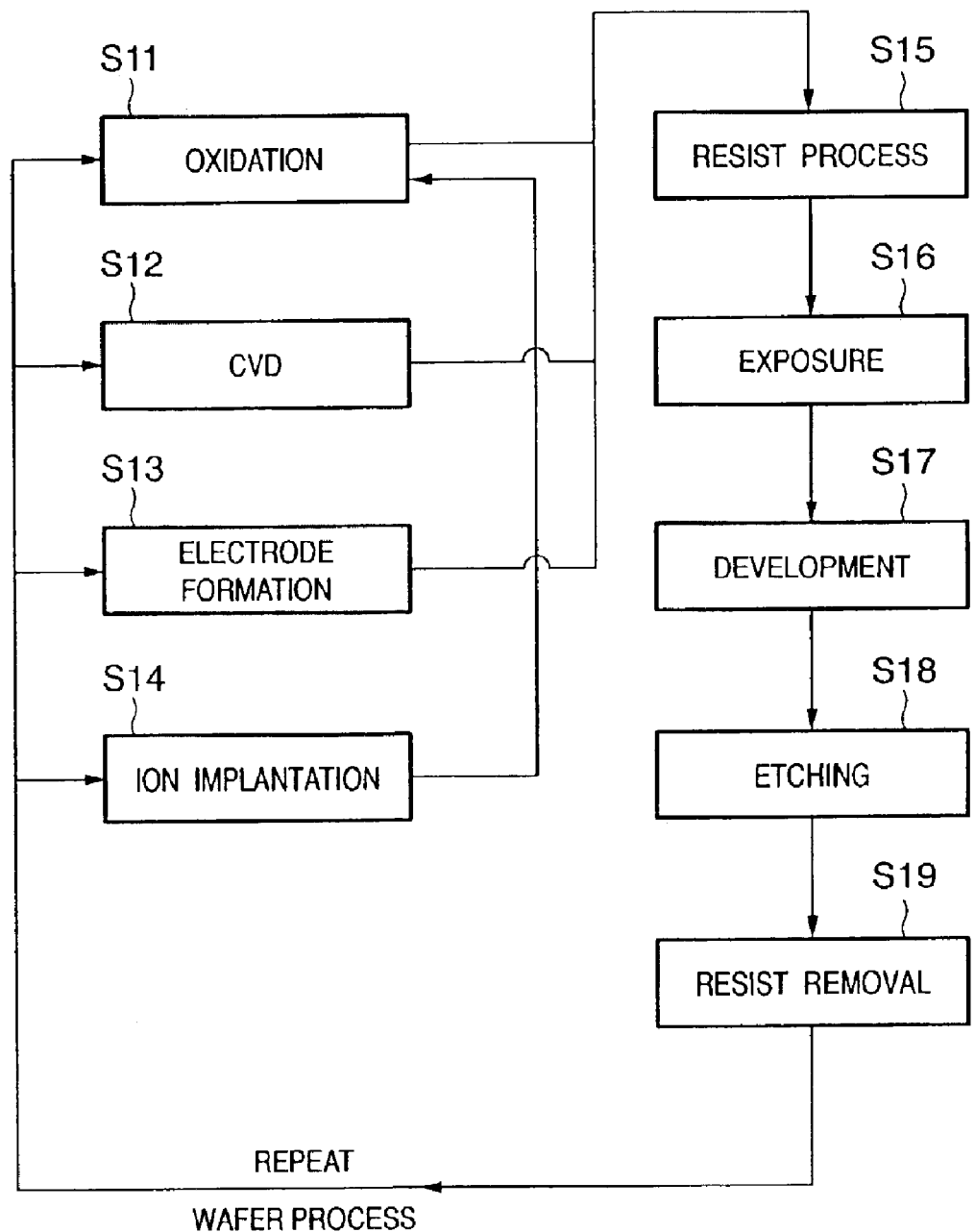
FIG. 10 is a flow chart showing the flow of the whole manufacturing process of a semiconductor device.

FIG. 10 shows the detailed flow of the above-mentioned wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the circuit pattern is transferred onto the wafer using the above-mentioned exposure apparatus. In step 17 (development), the exposed wafer is developed. In step 18 (etching), the resist is etched except for the developed resist image. In step 19 (resist removal), an unnecessary resist after etching is removed. These steps are repeated to form multiple circuit patterns on the wafer.

According to the above-described preferred embodiment of the present invention, the four reaction force counters (XF) 125, (XB) 25, (YL) 124, and (YR) 24, which can move independently, are provided. The ends of the four reaction force counters, however, may be coupled to each other to constitute one reaction force counter. In this case, it becomes difficult to some degree to control the reaction force of a moment component, while the mass ratio between the reaction force counter and a movable portion increases. Accordingly, the moving amount of the reaction force counter in canceling a reaction force generated upon driving an object or reducing its effect can be decreased.

According to the present invention, it is possible to, for example, cancel a reaction force generated upon driving an object or to reduce its effect.

As many apparently widely different embodiments of the present invention can be made without departing from the spirit and scope thereof, it is to be understood that the invention is not limited to the specific embodiments thereof except as defined in the appended claims.

What is claimed is:

1. A driving apparatus which drives an object along a guide surface in X and Y directions, said apparatus comprising:
   a first actuator which drives the object in the X direction;
   a second actuator which drives the object in the Y direction; and
   a controller which controls said first and second actuators,
   wherein said first and second actuators each have a reaction force counter which moves upon receipt of a reaction force generated in driving the object, and
   in moving the object standing at a first position to a second position and stopping the object, said controller controls said first and second actuators such that an acceleration period during which said first actuator accelerates the object and an acceleration period during which said second actuator accelerates the object coincide with each other, and a deceleration period during which said first actuator decelerates the object and a deceleration period during which said second actuator decelerates the object coincide with each other, so as to move the object on a straight line connecting the first position and the second position.

2. The apparatus according to claim 1, wherein the reaction force counter comprises a first reaction force counter serving as a stator of said second actuator.

3. The apparatus according to claim 2, further comprising:
   a third actuator which drives the first reaction force counter; and
   a fourth actuator which drives the second reaction force counter.

4. The apparatus according to claim 3, wherein
   a moment reaction force γ in a rotational direction is calculated by:

$$\gamma = F \frac{x_2 y_1 - x_1 y_2}{\sqrt{(x_2 - x_1)^2 + (y_2 - y_1)^2}}$$

where F is a driving force generated in moving a stage from coordinates $(x_1, y_1)$ to coordinates $(x_2, y_2)$, and
   the moment reaction force γ is distributed to either of the reaction force counters to be canceled or reduced.

5. The apparatus according to claim 3, wherein said controller controls said third and fourth actuators so as to cancel a reaction force generated upon driving the object or to reduce an effect of the reaction force.

6. The apparatus according to claim 3, wherein said controller controls said third and fourth actuators so as to cancel a moment reaction force generated upon driving the object or to reduce an effect of the moment reaction force.

7. The apparatus according to claim 3, wherein said controller controls the said first, second, third, and fourth actuators such that an acceleration period during which said first and second actuators accelerate the object and an acceleration period during which said third and fourth actuators accelerate the first and second reaction force counters coincide with each other, and a deceleration period during which said first and second actuators decelerate the object and a deceleration period during which said third and fourth actuators decelerate the first and second reaction force counters coincide with each other.

8. The apparatus according to claim 1, wherein said first actuator is arranged on each of a −Y direction side and a +Y direction side of the object, and said second actuator is arranged on each of a −X direction side and a +X direction side of the object.

9. The apparatus according to claim 2, wherein said first actuator is arranged on each of a −Y direction side and a +Y direction side of the object, said second actuator is arranged on each of a −X direction side and a +X direction side of the object, and the apparatus further comprises:

a pair of third actuators which drive first reaction force counters of a pair of said first actuators, respectively; and a pair of fourth actuators which drive first reaction force counters of a pair of said first actuators, respectively.

10. The apparatus according to claim 9, wherein said controller controls said pair of third actuators and said pair of fourth actuators so as to cancel a reaction force generated upon driving the object or to reduce an effect of the reaction force.

11. The apparatus according to claim 9, wherein said controller controls said pair of third actuators and said pair of fourth actuators so as to cancel a moment reaction force generated upon driving the object or to reduce an effect of the moment reaction force.

12. A driving apparatus which drives an object along a guide surface in X and Y directions, said apparatus comprising:

a first actuator which drives the object in the X direction;

a second actuator which drives the object in the Y direction; and a controller which controls said first and second actuators, wherein said first actuator has a first reaction force counter which moves upon receipt of a reaction force generated in driving the object, and said second actuator has a second reaction force counter which moves upon receipt of a reaction force generated in driving the object, and in moving the object standing at a first position to a second position and stopping the object, said controller controls said first and second actuators such that a moment reaction force, which is uniquely defined by a driving force with which said first and second actuators drive the object, and coordinates of the first position and coordinates of the second position are generated.

13. The apparatus according to claim 12, further comprising a third actuator which drives at least one of the first and second reaction force counters so as to cancel the moment reaction force or to reduce an effect of the moment reaction force.

14. An exposure apparatus comprising:

a driving apparatus as defined in claim 1, configured as a substrate stage which drives a structure including a chuck for holding a substrate; and a projection optical system which projects a pattern onto the substrate.

15. An exposure apparatus having a driving apparatus as defined in claim 1.

16. A device manufacturing method comprising:

a step of coating a substrate with a photosensitive agent;

a step of exposing the substrate using an exposure apparatus as defined in claim 14; and a step of developing the substrate.

17. A driving apparatus which drives an object along a guide surface in X and Y directions, said apparatus comprising:

a first actuator which drives the object in the X direction;

a second actuator which drives the object in the Y direction;

a third actuator which drives a stator of said first actuator;

a fourth actuator which drives a stator of said second actuator; and a controller which controls said third and fourth actuators, based on acceleration command values for the object.

18. The apparatus according to claim 17, wherein the stators of said first and second actuators are controlled so as to cancel a reaction force generated upon driving the object.

19. An exposure apparatus comprising:

a driving apparatus as defined in claim 17, configured as a substrate stage whcih drives a structure including a chuck for holding a substrate; and a projection optical system which projects a pattern onto the substrate.

* * * * *

UNITED STATES PATENT AND TRADEMARK OFFICE
CERTIFICATE OF CORRECTION

PATENT NO. : 6,891,597 B2
DATED : May 10, 2005
INVENTOR(S) : Hiroyuki Sekiguchi

It is certified that error appears in the above-identified patent and that said Letters Patent is hereby corrected as shown below:

Column 2,
Line 16, "footprint" should read -- the footprint --.
Line 34, "object to, e.g., cancel" should read -- object, e.g., to cancel --.

Column 5,
Line 4, "direction." should read -- directions. --.
Line 12, "direction," should read -- directions, --.

Column 6,
Line 25, "38 to" should read -- 38 is to --.
Line 31, "driven so as" should read -- driven as --.
Line 41, "so move" should read -- move so --.

Column 10,
Line 1, "equation." should read -- equation --.
Line 10, "-$F_y(t)$" should read -- -$f_y(t)$. --.
Line 25, "$2L_y$," should read -- $2L_y$ --.

Column 12,
Line 29, "(XE) 125," should read -- (XF) 125, --.

Column 14,
Line 30, "second" should read -- first actuator and a second reaction force counter serving as a stator of said second --.
Line 58, "the said" should read -- said --.

UNITED STATES PATENT AND TRADEMARK OFFICE
CERTIFICATE OF CORRECTION

PATENT NO. : 6,891,597 B2
DATED : May 10, 2005
INVENTOR(S) : Hiroyuki Sekiguchi

It is certified that error appears in the above-identified patent and that said Letters Patent is hereby corrected as shown below:

Column 16,
Line 40, "wchih" should read -- which --.

Signed and Sealed this

Twenty-fourth Day of January, 2006

JON W. DUDAS
*Director of the United States Patent and Trademark Office*